VOLTAGE INTEGRATOR CIRCUIT

Filed Sept. 21, 1962

INVENTORS
ROBERT L. WORTHINGTON
ERNEST HARTOG
MENASHE TEITELBAUM

BY [signature]
ATTORNEY

3,286,100
VOLTAGE INTEGRATOR CIRCUIT

Robert L. Worthington, East Orange, N.J., and Ernest Hartog, New York, and Menashe Teitelbaum, Brooklyn, N.Y., assignors to The Bendix Corporation, Teterboro, N.J., a corporation of Delaware
Filed Sept. 21, 1962, Ser. No. 225,337
16 Claims. (Cl. 307—88.5)

This invention relates to integrators for integrating unipolar or bipolar pulsating signals over a wide amplitude range.

The novel voltage integrator circuit of this invention was developed to meet a design requirement for a lightweight, compact, long time delay circuit which has rapid repeat characteristics and which is accurately operative over a wide signal amplitude range. The patent to Sykes 2,860,260, patented November 11, 1958, discloses a voltage integrator which will not repeat rapidly nor can the time control be corrected nor will it operate accurately over a wide signal range. The Sykes integrator does not operate satisfactorily and the present invention overcomes the deficiencies of the Sykes patent.

One object of the invention is to provide a voltage integrator having means for rapid repeat operation.

Another object of the invention is to provide means for readily changing the time constant of the integrator.

Another object of the invention is to operate the integrator over a large signal voltage range in the bipolar mode and eliminate the need for additional circuits to attenuate the signal voltage before integration or amplify the signal voltage after integration.

Another object of the invention is to provide an integrator responsive to bipolar signals and including a condenser and a pair of transistors and means in each transistor circuit for independently varying the gain of each transistor to avoid the use of perfectly matched transistors.

Another object of the invention is to provide an integrator responsive to bipolar signals and including a condenser and a pair of transistors and means in each transistor circuit for preventing low leakage current through the transistors.

The invention contemplates a voltage integrator comprising an input for receiving signals, an output connected to the input through a resistor, two circuits including a diode, a transistor having a base, and a condenser connected to the base of the transistor and to the diode, said circuits being connected in parallel with the output so that the transistor conducts when a signal of one polarity is applied to the input and the magnitude of the current through the transistor is determined by the charge on the condenser.

The invention also contemplates a voltage integrator comprising an input for receiving positive and negative signals, an output connected to the input through a resistor, two circuits each including a diode and a transistor connected in parallel with the output, each of the transistors having a base, and the bases of the transistors being connected together, and a condenser charged by the signals and connected to the transistor bases so that one of the transistors conducts when a positive signal is applied to the input and the other transistor conducts when a negative signal is applied to the input, and the magnitude of the current through the transistors is determined by the charge on the condenser.

The foregoing and other objects and advantages of the invention will appear more fully hereinafter from a consideration of the detailed description which follows, taken together with the accompanying drawings wherein several embodiments of the invention are illustrated by way of example. It is to be expressly understood, however, that the drawings are for illustration purposes only and are not to be construed as defining the limits of the invention.

Figure 1:
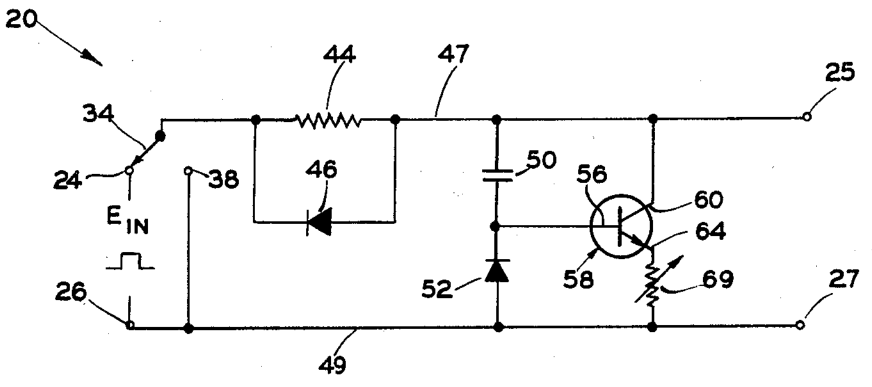
FIGURE 1 is a schematic wiring diagram of an integrator circuit constructed according to the invention for integrating positive pulses.

Referring to the drawings and more particularly to FIGURE 1, shown therein is a novel integrator 20 adapted to integrate unipolar positive pulses $E_{in}$ applied to input terminals 24, 26. Input terminal 24 is connected through a switch arm 34, parallel connected resistor 44 and diode 46 and a lead 47 to output terminal 25. Input terminal 26 is connected through lead 49 to output terminal 27. A condenser 50 and a diode 52 are connected in series between leads 47 and 49 in parallel with output terminals 25, 27. An NPN transistor 58 has its base 56 connected between condenser 50 and diode 52 and its collector 60 connected to lead 47. Emitter 64 of transistor 58 is connected through a resistor 69 to lead 49 so that the transistor is connected in parallel with output terminals 25, 27. Switch arm 34 may be moved to contact 38 connected to lead 49 to disconnect the voltage $E_{in}$ from the integrator and to discharge condenser 50 for rapid repeat operation.

With switch contact arm 34 in the position shown in FIGURE 1 in contact with input contact 24, positive pulses $E_{in}$ are applied to input terminals 24, 26, and capacitor 50 charges slowly since a voltage corresponding to $E_{in}$ appears across NPN transistor 58 and the transistor 58 is initially fully conducting and little or no output appears at terminals 25, 27. As capacitor 50 continues to charge, the bias on base 56 increases and the transistor current flow decreases. So that the potential across output terminals 25, 27 increases, transistor 58 initially diverts current from capacitor 50 which otherwise would charge capacitor 50 at a rate depending upon the time constant of resistor 44 and capacitor 50. The time necessary to fully charge capacitor 50 is effectively increased by the current gain of transistor 58. To discharge capacitor 50 for fast repeat operation switch arm 34 is moved from contact 24 to contact 38 to disconnect voltage $E_{in}$ from the integrator and provide a connection across capacitor 50 so that capacitor 50 discharges through bypass diode 46, switch arm 34, contact 38, and diode 52.

The integrator circuit shown in FIGURE 1 and constructed according to the invention is responsive to positive pulses and is particularly adapted for extremely fast repeat operation.

Figure 2:
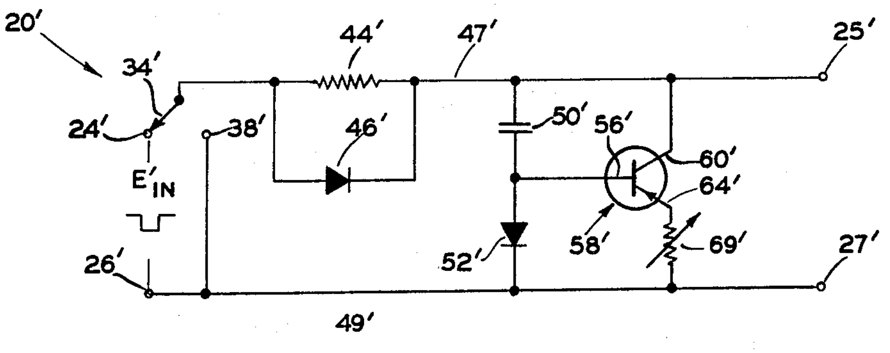
FIGURE 2 is a schematic wiring diagram of an integrator circuit constructed according to the invention for integrating negative pulses.

In FIGURE 2 is disclosed an integrator 20' particularly adapted to integrate unipolar negative pulses. Integrator 20' differs from integrator 20 of FIGURE 1 in that the voltage $E'_{in}$ is negative and diodes 46' and 52' are reversed. Also, a PNP transistor 58' is used instead of NPN transistor 58. Since the structure and the operation of integrator circuit 20' are identical to that of integrator 20, the components of integrator 20' have been given primed reference numerals corresponding to the components of the integrator 20 and the operation of integrator 20' need not be further described.

Diodes 46 and 52 in FIGURE 1 and 46' and 52' in FIGURE 2 provide for rapid discharge of capacitor 50 in FIGURE 1 and 50' in FIGURE 2 for fast recycling.

Resistor 69 in FIGURE 1 and 69' in FIGURE 2 may be adjusted to modify the time constant of the circuits.

Figure 3:
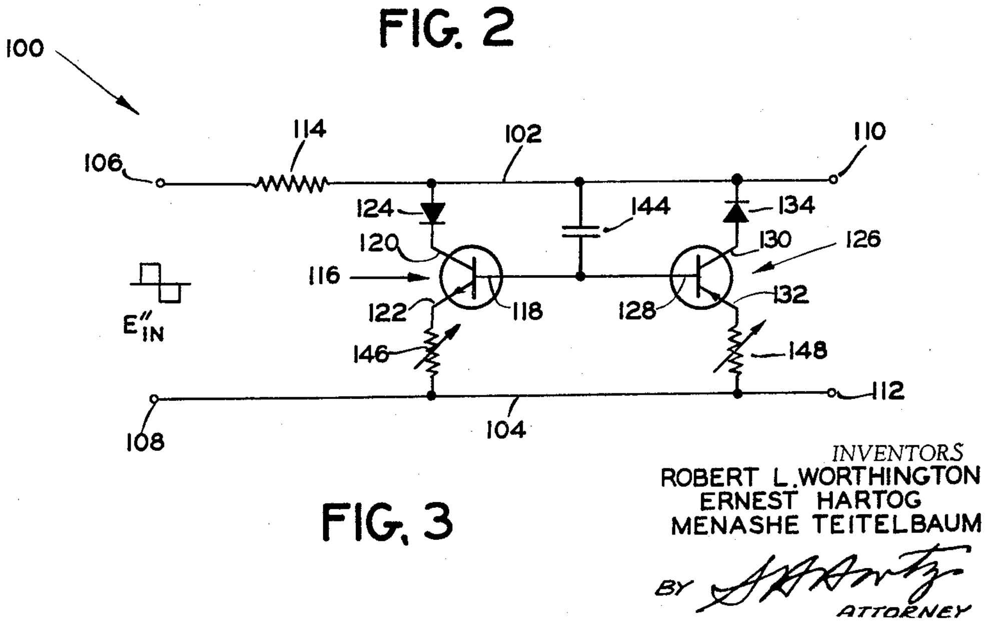
FIGURE 3 is a schematic wiring diagram of an integrator circuit constructed according to the invention for integrating both positive and negative pulses.

In FIGURE 3 is shown an integrator 100 constructed according to the invention and responsive to positive and negative pulses $E''_{in}$. The signal pulses $E''_{in}$ are applied to input terminals 106, 108 and the integrated output appears at terminals 110, 112. Input terminal 106 is connected through resistor 114 and lead 102 to output terminal 110 and input terminal 108 is connected by lead 104 to output terminal 112. An NPN transistor 116 and a PNP transistor 126 have their collectors 120 and 130 connected through diodes 124 and 134, respectively, to lead 102 and their emitters 122 and 132 connected through resistors 146 and 148, respectively, to lead 104. Base 118 of transistor 116 and base 128 of transistor 126 are connected through a condenser 144 to lead 102. Resistor 114 and condenser 144 comprise a resistance capacitance network for integrating the signal $E''_{in}$. Transistors 116 and 126 are preferably matched as closely as possible, but resistors 146 and 148 may be adjusted to match the gain characteristics of the associated transistors and also to vary the time contant of the integrator.

When a source of positive pulsating signal voltage $E''_{in}$ is connected across input terminals 106, 108, with condenser 144 fully discharged, diode 124 passes positive pulses and transistor 116 initially fully conducts positive pulses. Condenser 144 gradually charges in one direction and changes the bias on base 118 of transistor 116 so that conduction through the transistor gradually decreases. Diode 124 blocks negative pulses so that transistor 116 conducts only when $E''_{in}$ is positive, and by blocking the negative pulses, prevents damage to transistor 116 during the presence of large signal voltages.

When $E''_{in}$ is negative and condenser 144 is fully discharged, the negative pulses are passed by diode 134 and transistor 126 initially is fully conducting and conduction gradually decreases as condenser 144 charges to change the bias on base 128 of transistor 126. Diode 134 blocks positive pulses so that transistor 126 conducts only when $E''_{in}$ is positive, and by blocking the positive pulse, prevents damage to transistor 126 during the presence of large signal voltages.

When both positive and negative pulses $E''_{in}$ are applied to input terminals 106, 108, one or the other of the transistors 116 or 126 conducts and condenser 144 gradually charges in one direction or the other. When condenser 144 is charged in one direction and the voltage $E''_{in}$ is reversed, condenser 144 gradually discharges until it is completely discharged and then charges in the opposite direction as signals of the same polarity continue to be applied to input terminals 106, 108. When $E''_{in}$ is zero, transistors 116 and 126 are both cut off and the charge on condenser 144 is maintained constant. As indicated above, when $E''_{in}$ becomes positive, transistor 116 conducts and transistor 126 is cut off. When $E''_{in}$ is negative, then transistor 126 conducts and transistor 116 is cut off. Which transistor conducts depends only upon the polarity of $E''_{in}$ and not upon the polarity or magnitude of the charge on condenser 144. The output voltage across terminals 110, 112 is proportional to the integral of the condenser charging current, which is the current through resistor 114 less the current diverted by transistor 116 or 126. Diodes 124 and 134 provide for rapid discharge of condenser 144. Resistors 146 and 148 may be adjusted to modify the time constant of the circuit. Diodes 124 and 134 prevent current leakage from lead 102 through the collector-base junction of one transistor and base-emitter junction of the other transistor to lead 104, and permit operation of the integrator over a wide range of signal voltages.

The novel integrator described herein repeats operation rapidly and the time constant of the integrator may be changed readily. The integrator may be operated over a large signal voltage range in the bipolar mode and eliminates the need for additional circuits to attenuate the signal voltage before integration or amplify the signal voltage after integration. The integrator is responsive to bipolar signals and includes resistors in each transistor circuit for independently varying the gain of each transistor to avoid the use of perfectly matched transistors and diodes in each transistor circuit for preventing low leakage current through the transistors, which would permanently damage the transistors.

While several embodiments of the invention have been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A voltage integrator comprising an input for receiving signals, an output connected to the input through a resistor, a circuit having a series connected variable resistor for changing the time constant of the integrator and a transistor having a base, the circuit being connected in parallel with the output, a condenser connected between the first-mentioned resistor and the base of the transistor so that the transistor conducts when a signal of one polarity is applied to the input and the magnitude of the current through the transistor is determined by the charge on the condenser.

2. A voltage integrator comprising an input for receiving signals, an output connected to the input through a resistor, a first circuit including a diode and condenser connected in series, a second circuit including a series connected variable resistor for changing the time constant of the integrator and a transistor having a base connected to the diode and condenser, the circuits being connected parallel with the output so that the transistor conducts when a signal of one polarity is applied to the input and the magnitude of the current through the transistor is determined by the charge on the condenser which charges through the transistor and variable resistor.

3. A voltage integrator comprising an input for receiving signals, an output connected to the input through a parallel connected resistor and diode, a first circuit including a diode and a condenser connected in series, a second circuit including a transistor having a base connected to the diode and condenser, said circuits being connected in parallel with the output so that the transistor conducts when a signal of one polarity is applied to the input and the magnitude of the current through the transistor is determined by the charge on the condenser.

4. A voltage integrator of the kind described in claim 3 including means for disconnecting the signals from the input and for discharging the condenser through the diodes.

5. A voltage integrator comprising an input for receiving positive signals, an output connected to the input through a resistor, a first circuit including an NPN transistor having a base, and a second circuit including a series connected condenser and diode connected at their junction to the base of the transistor, said circuits being connected in parallel with the output so that the transistor conducts when a positive signal is applied to the input and the magnitude of the current through the transistor is determined by the charge on the condenser.

6. A voltage integrator comprising an input for receiving negative signals, an output connected to the input through a resistor, a first circuit including a PNP transistor having a base, and a second circuit including a series connected condenser and diode connected at their junction to the base of the transistor, said circuits being connected in parallel with the output so that the transistor conducts when a negative signal is applied to the input and the magnitude of the current through the transistor is determined by the charge on the condenser.

7. A voltage integrator comprising an input for receiving signals, an output connected to the input through a pair of connectors, a parallel connected resistor and diode connected in series with one of the connectors, a first circuit including a series connected condenser and diode connected between the connectors in parallel with the output, and a second circuit including a transistor connected in parallel with the output and having a collector connected to one of the connectors and an emitter connected to the other connector and a base connected at a point in the first circuit between the condenser and diode, the transistor conducting when a signal of one polarity is applied to the input and the magnitude of the current through the transistor being determined by the charge on the condenser.

8. A voltage integrator of the kind described in claim 7 which includes a resistor connected in the second circuit to the emitter of the transistor and in series with the transistor for changing the time constant of the integrator.

9. A voltage integrator of the kind described in claim 7 including means for disconnecting the signals from the input and for discharging the condenser through the diodes.

10. A voltage integrator comprising an input for receiving positive signals, an output connected to the input through a pair of connectors, a parallel connected resistor and diode connected in series with one of the connectors, a first circuit including a series connected condenser and diode connected between the connectors in parallel with the output, and a second circuit including an NPN transistor connected in parallel with the output and having a collector connected to one of the connectors and an emitter connected to the other connector and a base connected at a point in the first circuit between the condenser and diode, the NPN transistor conducting when a positive signal is applied to the input and the magnitude of the current through the NPN transistor being determined by the charge on the condenser.

11. A voltage integrator comprising an input for receiving negative signals, an output connected to the input through a pair of connectors, a parallel connected resistor and diode connected in series with one of the connectors, a first circuit including a series connected condenser and diode connected between the connectors in parallel with the output, and a second circuit including a PNP transistor connected in parallel with the output and having a collector connected to one of the connectors and an emitter connected to the other connector and a base connected at a point in the first circuit between the condenser and diode, the PNP transistor conducting when a negative signal is applied to the input and the magnitude of the current through the PNP transistor being determined by the charge on the condenser.

12. A voltage integrator comprising an input for receiving positive and negative signals, an output connected to the input through a resistor, two circuits connected in parallel with the output and each including a diode and a transistor, each of the transistors having a base, and the bases of the transistors being connected together, and a condenser connected to the transistor bases and to the other so that one of the transistors conducts when a positive signal is applied to the input and the other transistor conducts when a negative signal is applied to the input and the magnitude of the current through the transistors is determined by the charge on the condenser.

13. A negative integrator comprising an input for receiving positive and negative signals, an output connected to the input through a resistor, two circuits connected in parallel with the output and each including a diode, a transistor, and a resistor in series, each of the transistors having a base, and the bases of the transistors being connected together, and a condenser connected to the transistor bases and to the first mentioned resistor so that one of the transistors conducts when a positive signal is applied to the input and the other transistor conducts when a negative signal is applied to the input and the magnitude of the current through the transistors is determined by the charge on the condenser.

14. A voltage integrator comprising an input for receiving positive and negative signals, an output connected to the input through a resistor, a pair of transistors each having a base, an emitter, and a collector, two circuits each including a transistor and a diode connected to the collector of the transistor, the circuits being connected in parallel with the output so that one of the transistors conducts when a positive signal is applied to the input and the other transistor conducts when a negative signal is applied to the input, and a condenser connected to the transistor bases and to the resistor so that the magnitude of the current through the transistors is determined by the charge on the condenser.

15. A voltage integrator comprising an input for receiving positive and negative signals, an output connected to the input, a PNP and an NPN transistor each having a base, a collector, and an emitter, two circuits each including a diode connected to the collector of a transistor and a resistor connected to the emitter of a transistor, the circuits being connected in parallel with the output so that one of the transistors conducts when a positive signal is applied to the input and the other transistor conducts when a negative signal is applied to the input, and a condenser connected to the transistor bases and to the input so that the magnitude of the current through the transistors is determined by the charge on the condenser.

16. A voltage integrator comprising an input for receiving positive and negative signals, an output connected to the input through a pair of connectors, a resistor connected in series with one of the connectors, a first circuit including a series connected diode, an NPN transistor and resistor connected between the connectors in parallel with the output, a second circuit including a series connected diode, a PNP transistor and a resistor connected between the connectors in parallel with the output so that one of the transistors conducts when a positive signal is applied to the input and the other transistor conducts when a negative signal is applied to the input, and a condenser connected to the transistor bases and to one of the connectors so that the magnitude of the current through the transistors is determined by the charge on the condenser.

References Cited by the Examiner

UNITED STATES PATENTS

| | | | |
|---|---|---|---|
| 2,780,752 | 2/1957 | Aldrich | 307—88.5 |
| 2,859,360 | 11/1958 | Suran | 307—88.5 |
| 3,116,441 | 12/1963 | Gieffers | 317—148 |
| 3,119,029 | 1/1964 | Russell | 307—88.5 |

OTHER REFERENCES

Electronics, pp. 74, 75, September 25, 1959, by Smauz et al.

DAVID J. GALVIN, *Primary Examiner.*